(12) United States Patent
Parker et al.

(10) Patent No.: US 9,349,564 B2
(45) Date of Patent: May 24, 2016

(54) CHARGED-PARTICLE LENS THAT TRANSMITS EMISSIONS FROM SAMPLE

(71) Applicant: FEI Company, Hillsboro, OR (US)

(72) Inventors: N. William Parker, Hillsboro, OR (US); Marcus Straw, Portland, OR (US); Jorge Filevich, Portland, OR (US)

(73) Assignee: FEI Company, Hillsboro, OR (US)

( * ) Notice: Subject to any disclaimer, the term of this patent is extended or adjusted under 35 U.S.C. 154(b) by 107 days.

(21) Appl. No.: 14/334,293

(22) Filed: Jul. 17, 2014

(65) Prior Publication Data

US 2016/0020062 A1    Jan. 21, 2016

(51) Int. Cl.
*H01J 37/12* (2006.01)
*H01J 37/26* (2006.01)
*H01J 37/244* (2006.01)

(52) U.S. Cl.
CPC ............ *H01J 37/12* (2013.01); *H01J 37/244* (2013.01); *H01J 37/26* (2013.01); *H01J 37/261* (2013.01); *H01J 2237/12* (2013.01); *H01J 2237/2445* (2013.01); *H01J 2237/24415* (2013.01); *H01J 2237/2602* (2013.01)

(58) Field of Classification Search
CPC ....... H01J 37/12; H01J 37/261; H01J 37/244; H01J 2237/12; H01J 2237/24415; H01J 2237/2445; H01J 2237/2602
See application file for complete search history.

(56) References Cited

U.S. PATENT DOCUMENTS

| 4,330,708 | A | | 5/1982 | Meisburger |
| 5,122,663 | A | | 6/1992 | Chang et al. |
| 5,430,292 | A | * | 7/1995 | Honjo et al. .......... H01J 37/244 250/310 |
| 6,373,070 | B1 | | 4/2002 | Rasmussen |
| 7,045,791 | B2 | * | 5/2006 | Benas-Sayag et al. . H01J 37/12 250/396 R |
| 8,314,386 | B2 | * | 11/2012 | Zaluzec ................ H01J 37/244 250/306 |
| 8,440,969 | B2 | * | 5/2013 | Moore et al. .... H01J 2237/2445 250/307 |
| 2003/0102436 | A1 | | 6/2003 | Benas-Sayag et al. |
| 2012/0112062 | A1 | | 5/2012 | Novak et al. |
| 2012/0319001 | A1 | * | 12/2012 | Tsunoda ................ H01J 37/12 250/396 R |

FOREIGN PATENT DOCUMENTS

EP    1724809 A1    11/2006

* cited by examiner

*Primary Examiner* — Jack Berman
(74) *Attorney, Agent, or Firm* — Scheinberg & Associates; Michael O. Scheinberg

(57) ABSTRACT

A transmissive lens in a charged particle beam column for detecting X-rays and light is provided. The final lens may include elements that are transmissive for X-rays for EDS imaging and analysis or elements that are transmissive for light for cathodoluminescent (CL) imaging and analysis. The final lens may be constructed and arranged to include elements that are transmissive for both X-rays and light for combined EDS and CL imaging and analysis.

23 Claims, 10 Drawing Sheets

CHARGED-PARTICLE LENS THAT TRANSMITS EMISSIONS FROM SAMPLE

TECHNICAL FIELD OF THE INVENTION

The present invention relates to charged particle beam columns used for observation of a sample and, more specifically, to a system including a lens having a portion that is transmissive to emissions used for imaging and/or analysis.

BACKGROUND OF THE INVENTION

Various types of optical devices are well-known in the field of electron microscopy to create a magnified image of an object, feature or component that is generally too small to be seen by the naked eye. Such devices may include the Transmission Electron Microscope (TEM), Scanning Electron Microscope (SEM), and Scanning Transmission Electron Microscope (STEM). Imaging of a sample is typically achieved by detecting emanations or output radiation from the sample caused by irradiation of the sample by the imaging beam. Such emanations may include secondary electrons, backscattered electrons, X-rays, light (visible light and near visible light such as near-IR and near-UV), and any combination of these. These imaging devices may be part of a "dual beam" system with an additional tool having a machining function to modify a sample by removing material, such as by milling or ablation, or adding material, such as by deposition. For example, such a dual beam system may include a Focused Ion Beam (FIB) for machining and an electron microscope for imaging.

In a typical dual beam system, each device or column is positioned as close to the sample as possible to enhance resolution and obtain good optics while providing enough space for various detectors or other various accessories to collect and detect emanations from the sample for imaging. However, space is typically limited near the point where the beams impact the sample. Because of space limitations each column is generally formed with a conical end allowing the column ends to abut so that they both can be located as near the sample as possible. In order to fit both columns into the space the ends of each column are necessarily spaced a working distance from the sample that typically may be between 13-16 mm. Such working distances have the advantage of providing room for various accessories, such as secondary electron detectors, backscattered electron detectors, and x-ray detectors. However, such working distances degrade the optics resulting in less than optimal imaging.

One example of such a dual beam system is shown and described in U.S. Pat. No. 6,373,070 to Rasmussen for "Method Apparatus For A Coaxial Optical Microscope With Focused Ion Beam." A beam system 10 includes a focused ion beam column 12 and an optical microscope column 14 for observing a specimen 16. The relationship between the two columns 12 and 14 is best seen in FIG. 2A. The system 10 includes a lens tube 32 that supports a camera 40, an illumination system 42, and a lens assembly 44. Light emitting diodes (LEDs) 70a and 70b illuminate the specimen 16 and a mirror assembly 56 collects light from the specimen 16 and reflects it into the lens assembly 44 for observation and/or imaging. It can be seen that the end of each column 12 and 14 is formed with a conical shape so that the columns 12 and 14 can be positioned in an abutting relationship to fit inside the small space above the specimen 16. This arrangement provides for adequate detection of emanations from the specimen 16 because it allows for space for positioning of each end of the columns 12 and 14 plus additional accessories such as the mirror assembly 56 and diodes 70a and 70b. However, in order to provide such space the columns 12 and 14 are necessarily spaced from the specimen 16 a relatively large working distance that degrades the optical quality of the image of the specimen 16.

Improved optical quality can be obtained with devices capable of working with smaller spot sizes, which require a smaller working distance between the sample and the optical column. This can be achieved by using a standard optical column alone but is difficult when it is desired to use a dual or multiple beam system. One way to achieve smaller working distances in a multicolumn system is to us smaller optical columns. Some columns are manufactured to be smaller than typical columns and are constructed to be as small as possible. Smaller or "mini" columns offer the advantages of being more economical to manufacture and requiring less space. Mini-columns can be used alone or as part of a multi-column system because there is no requirement for coincident beams the columns do not have to be crowded together in a small space. Therefore, the ends of each column can be located much closer to the sample than typical beam columns allowing for much smaller working distances enabling smaller spot sizes at the sample providing better optics. However, whether using a stand-alone column or a multi-column system a small working distance makes detecting of emanations from the sample more difficult due to the angle at which emanations from the sample are projected and lack of space for detectors.

A typical charged particle optical column employing an electrostatic final lens includes one or more electrodes in the final lens through which the primary beam is projected. The electrodes control and focus the primary beam onto the sample. When it is desired to form an image by detecting secondary electrons or backscattered electrons a through-the-lens (TTL) detection system can be used in which the electrodes are biased to draw the electrons from the sample up through the lens. The electrons are then detected by an element, such as a channel plate electron multiplier, located within the lens. However, current TTL detectors are not useful when it is desired to form an image using X-rays or reflected light from the sample because the electrodes within the lens would block the X-rays and light.

What is needed is a charged particle optical column that is capable of use with small working distances from the sample while allowing for collection of emissions, such as X-rays and/or light, for detection and imaging.

SUMMARY OF THE INVENTION

An object of the invention, therefore, is to provide a charged particle beam system that can detect emissions, such as X-rays and light, from a sample, while providing a small working distance of the final lens from the sample.

Embodiments provide an optical column in which at least a portion of the final lens of the optical column is transmissive of the emissions to be detected. For example, the final lens may include one or more elements transmissive only for X-rays, one or more elements transmissive only for light, or one or more elements transmissive for both X-rays and light for detection.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
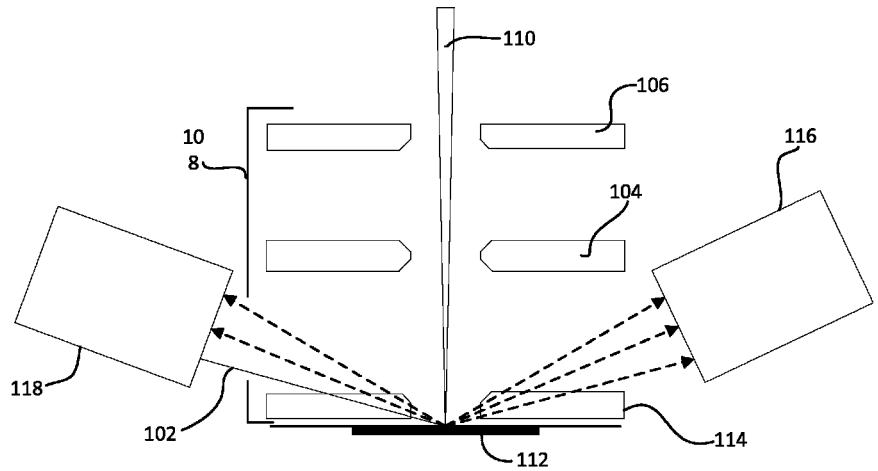
FIG. 1 is a diagrammatic representation of a relevant part of a transmissive lens in a charged particle beam column for low angle X-ray detection according to the invention.

According to preferred embodiments of the present invention, a lens is provided that has a portion that is transmissive to provide emissions, such as light and/or X-ray emanations, from a sample to a detector for use in imaging and analysis. By "transmissive" is meant that the material passes a sufficient amount of radiation to provide a useful signal for imaging or analysis. The stronger the signal from the sample and the more sensitive the detector, the greater is the loss that can be tolerated during transmission. A transmissive material is not necessarily completely transparent to the radiation and may still attenuate the signal to some extent. "Light" is defined hereinafter as visible light and near visible light such as near-IR and near-UV. Embodiments are particularly useful in charged-particle beam columns having high throughputs and small working distances.

In a typical charged particle column the primary beam travels along a path through various electrodes and lenses before traversing through a final lens to impact a sample to be imaged and analyzed. Impact of the beam onto the sample causes various emanations to be radiated from the sample, such as X-rays and light. In some applications, it is desirable to acquire imaging and/or analytical information using X-rays emitted from the sample in a process called Energy Dispersive Spectroscopy (EDS or EDAX). In other applications, it is desirable to acquire imaging and/or analytical information using light emitted from the sample, such as in cathodoluminescence (CL). In yet other applications, it is desirable to acquire imaging and/or analytical information using both X-rays and light emitted from the sample.

In some embodiments, a charged particle optical column includes an electrostatic final lens containing multiple electrodes in which at least the final electrode is composed of material having a low atomic number to permit transmission of X-rays from a sample spaced a small working distance below the final lens. Additional electrodes in the lens may also be composed of material having a low atomic number for transmission of X-rays. In some embodiments, less than the entire electrode is transmissive, as long as the portion of the electrode between beam impact point and the detector is transmissive.

In some embodiments, a charged particle optical column includes an electrostatic final lens containing multiple electrodes in which at least a part of the final electrode is composed of material to permit transmission of visible or near-visible (UV, IR) light from the sample spaced a small working distance below the final lens. Additional electrodes, or portions thereof, in the lens may also be composed of material permitting transmission of light from the sample.

In some embodiments, a charged particle optical column having an electrostatic final lens in which a first portion of the final electrode is composed of material to permit transmission of X-rays and a second portion of the final electrode is composed of material to permit transmission of visible or near-visible (UV, IR) light.

In yet another aspect of the invention, detectors are provided to detect X-rays, light, or both. Detectors may be positioned at the side of the column near the sample and oriented generally toward the intersection of the primary beam and the sample surface. One, two three, four, or more detectors can be positioned around the optical axis. Portions of the final electrode in the final lens may fall along the line-of-sight between the detectors and the sample. By providing a transmissive final lens element, the final lens element can be positioned closer to the sample, thereby decreasing the working distance while still allowing emissions to reach one or more detectors. By providing transmissive elements, the elevation angle between the sample and the detector can be increased because a line of sight from the sample to the detector is no longer required to extend under the final lens element. Moreover, the acceptance angle of the detector can be increased. The acceptance cone that defines the emissions from the sample that will fall on the detector can pass through the transmissive portion of the lens elements, allowing higher elevation angles and larger acceptance angles.

FIGS. 1-6 illustrate embodiments of the invention for EDS imaging and analysis. FIG. 1 shows a relevant part of a charged particle beam column according to the invention. In as far as they are not relevant to the invention, the charged particle source and all further elements forming part of the charged particle column, serving to accelerate and control the primary beam, are not shown. As seen in FIG. 1, electrodes 102, 104, and 106 make up a final electrostatic lens 108 through which the beam 110 travels to impact a sample 112. Lens 108 is capable of being located within about 1 mm from sample 112. This small working distance enables smaller spot sizes at the sample to be achieved which provides better optics. Electrodes 102, 104, and 106 are shaped in a known conventional manner to meet the requirements for generating the focusing electric field for the primary beam 110 as it travels along an optical path through electrodes 102, 104, and 106 toward sample 112. As beam 110 impacts sample 112 X-rays 114 are emitted from sample 112. In general, X-rays radiate isotropically or uniformly in all directions from a point of radiation. The X-rays that radiate back through lens 108 are transmitted through one or more electrodes that are constructed to be transmissive for X-rays. The electrodes that are transmissive for X-rays within lens 108 are constructed from a material and with a configuration allowing for the least amount of X-ray absorption and a maximum amount of X-ray transmission to provide for X-ray detection. Preferably, the transmissive electrodes are formed from a material having a low atomic number so as to be transmissive for X-rays. A preferred material is Beryllium although other materials are contemplated by this invention. The X-rays that radiate from sample 112 back through lens 108 are transmitted through one or more electrodes and detected by X-ray detectors 116 and 118. Although only two X-ray detectors 116 and 118 are shown any number of detectors may be used and located at any desired position to detect X-rays emitted from the sample. Detectors 116 and 118 may be connected to a device (not shown) for imaging and analysis.

Figure 2:
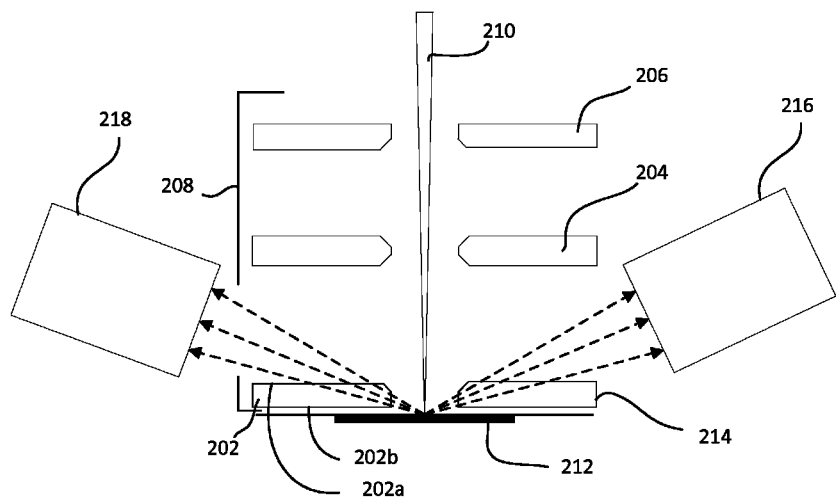
FIG. 2 shows another embodiment of a transmissive lens for low angle X-ray detection.
Figure 3:
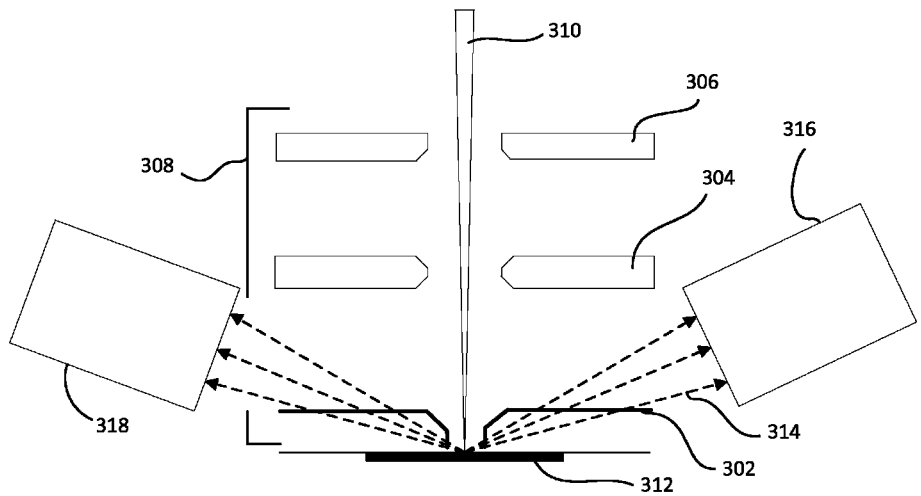
FIG. 3 shows yet another embodiment of a transmissive lens for low angle X-ray detection.

Generally, X-rays are transmitted through a material with a certain amount of absorption for each unit length of travel through the material. Therefore, the transmissive electrodes within lens 108 may be formed in various configurations to allow for optimal X-ray transmission depending on the application. In the embodiment of FIG. 1, electrode 102 is a solid plate made from a transmissive material so that X-rays 114 that radiate at lower angles from sample 112 are transmitted through electrode 102 without any substantial attenuation to be detected by X-ray detectors 116 and 118. FIG. 2 shows an embodiment similar to that shown in FIG. 1 in which electrodes 202, 204, and 206 make up a final electrostatic lens 208 through which the beam 210 travels to impact a sample 212. X-rays 214 radiate from sample 212 and are transmitted through electrode 202 and detected by X-ray detectors 216 and 218. In this embodiment, electrode 202 is formed as a hollow plate with upper and lower surfaces 202a and 202b made from thin sheets of an X-ray transmissive material. If desired, ribs (not shown) may be provided to connect upper and lower surfaces 202a and 202b to add strength. FIG. 3 shows an embodiment similar to that shown in FIG. 1 in which electrodes 302, 304, and 306 make up a final electrostatic lens 308 through which the beam 310 travels to impact a sample 312. X-rays 314 radiate from sample 312 and are transmitted through electrode 302 and detected by X-ray detectors 316 and 318. In this embodiment, electrode 302 is formed as a single thin sheet of an X-ray transmissive material. If desired, ribs (not shown) may be attached to the side of electrode 302 away from electrode 304 to add strength.

Figure 4:
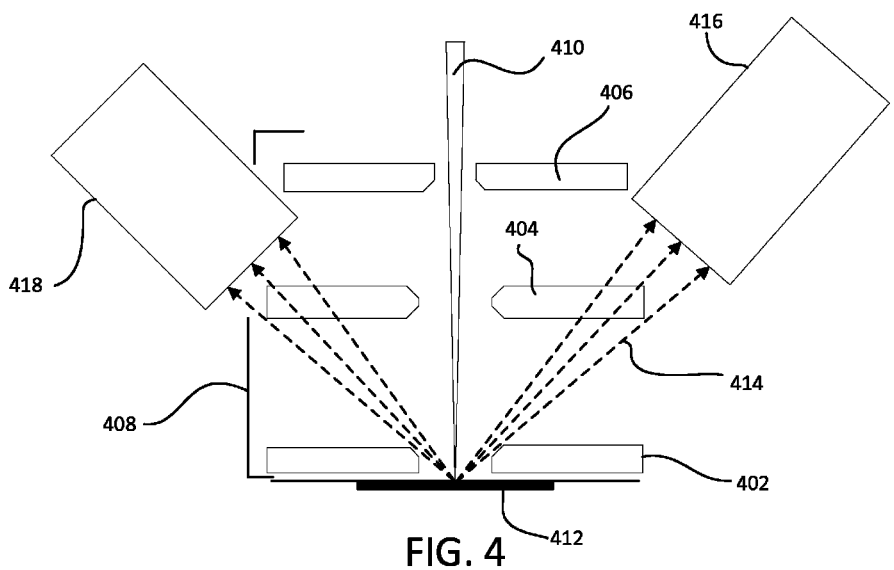
FIG. 4 shows an embodiment of the invention for detecting X-rays radiated at a greater angle.
Figure 5:
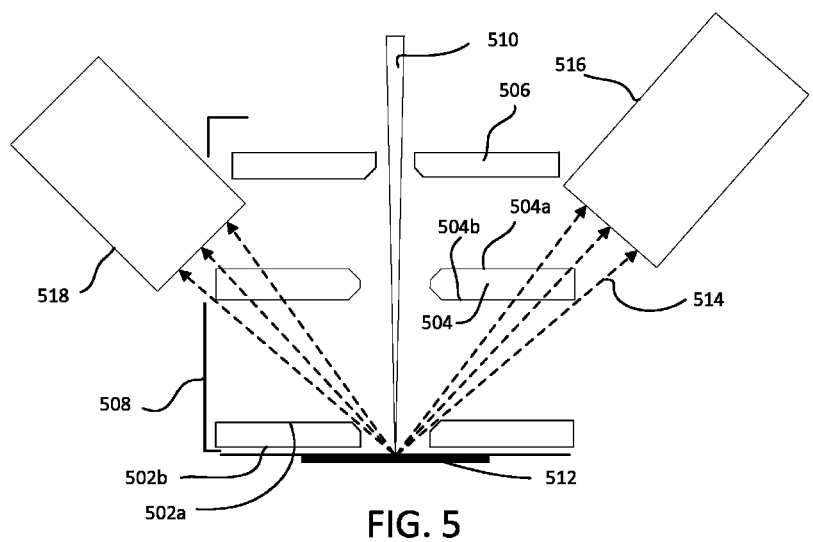
FIG. 5 is another embodiment of the invention for detecting X-rays radiated at a greater angle.
Figure 6:
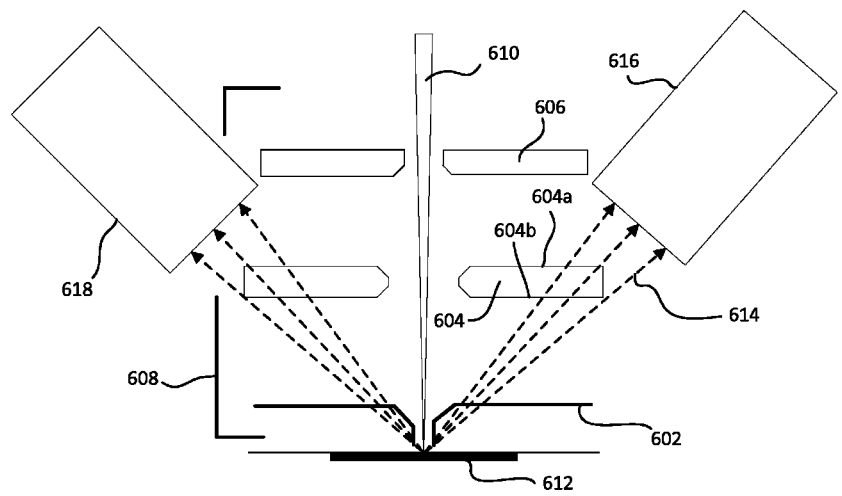
FIG. 6 is yet another embodiment of the invention for detecting X-rays radiated at a greater angle.

FIGS. 4-6 show embodiments for detecting X-rays that radiate from a sample at a greater angle than that shown in FIGS. 1-3. FIG. 4 shows an embodiment in which electrodes 402, 404, and 406 make up a final electrostatic lens 408 through which the beam 410 travels to impact sample 412. X-rays 414 radiate from sample 412 and are transmitted through both electrodes 402 and 404. In this embodiment, both electrodes 402 and 404 are formed as solid plates made from an X-ray transmissive material. Detectors 416 and 418 are located axially away from sample 414 detect X-rays 414 radiating at this angle. In the embodiment of FIG. 5, electrodes 502, 504, and 506 make up a final electrostatic lens 508 through which the beam 510 travels to impact sample 512. X-rays 514 radiate from sample 512 and are transmitted through both electrodes 502 and 504 and are detected by X-ray detectors 516 and 518. In this embodiment, both electrodes 502 and 504 are formed as hollow plates, each having upper and lower surfaces, 502a, 502b and 504a, 504b, respectively, made from thin sheets of an X-ray transmissive material. If desired, ribs (not shown) may connect the upper and lower surfaces 502a and 502b of electrode 502 and/or upper and lower surfaces 504a and 504b of electrode 504 to add strength. In the embodiment of FIG. 6, electrodes 602, 604, and 606 make up a final electrostatic lens 608 through which the beam 610 travels to impact sample 612. X-rays 614 radiate from sample 612 and are transmitted through both electrodes 602 and 604 and are detected by X-ray detectors 616 and 618. In this embodiment, electrode 604 is formed as a hollow plate with upper and lower surfaces 604a and 604b made from thin sheets of an X-ray transmissive material and electrode 602 is formed as a single thin sheet of an X-ray transmissive material. If desired, ribs (not shown) may connect upper and lower surfaces 604a and 604b of electrode 604 for strength. Additionally, ribs (not shown) may be attached to the side of the electrode 602 away from electrode 604 for strength.

The form of the X-ray transmissive electrode, whether a solid plate, a hollow plate, or a thin sheet, may depend on the application and the rate at which the X-rays are attenuated (absorbed through the material or scattered). It is generally desirable have a lesser percentage of attenuated X-rays so that a higher percentage of X-rays is transmitted through the material for detection. The following table shows the percentage of X-ray transmission for thicknesses of material ranging from 0.1 mm up to 6.0 mm and for various X-ray energy levels ranging from 1.0 keV up to 50.0 keV. Transmission depends not only on material thickness but also on the angle at which the X-rays radiate. For example, referring to FIG. 2, if the upper and lower surfaces 202a and 202b of electrode 202 are each 0.1 mm thick and X-rays radiate at a 60° angle relative to the beam axis, then the length of the X-ray path through the material is determined by the equation:

$$\frac{(0.1 \text{ mm} + 0.1 \text{ mm})}{\cos(60)}$$

Figure 10:
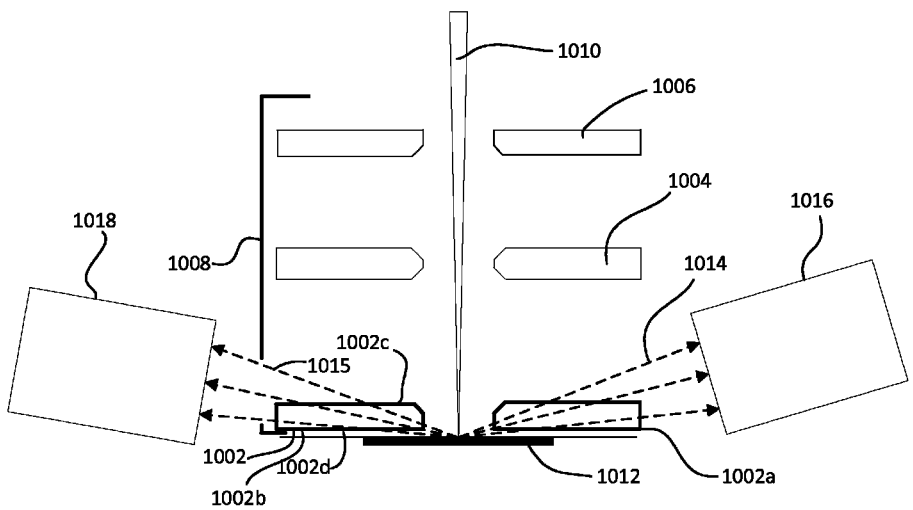
FIG. 10 is another embodiment for detecting low angle X-rays and light.

This results in a path length of 0.4 mm through the material. From the table below it can be seen that the expected transmission for X-rays at 4.0 keV is 52.62%. In another example, referring to FIG. 3, if the thin sheet electrode 302 is 0.1 mm thick and the X-ray angle is 60° relative to the beam axis, using the formula above results in a path length of 0.2 mm. Thus, lower energy X-rays of 2.0 keV have an expected transmission of 6.33%, while higher energy X-rays at 4.0 keV have an expected transmission of 72.54%. The required minimum transmission depends on the application. For example, the larger the signal from the sample and the greater the sensitivity of the detector, the greater attenuation can be tolerated. For example, the signal from the sample depends on the electron beam current and the probability, for each electron impinging on the sample, of the sample emitting the type of emission, e.g., a particular x-ray line, to be detected. For a large electron current, therefore, a lower transmission is tolerated, but a large electron current implies a larger beam with reduced resolution. The required transmission therefore can therefore vary greatly. In some embodiments, the transmission of the lens element is greater than 90%, greater than 80%, greater than 60%, greater than 40%, greater than 20%, or greater than 10%.

ted through portion 902a of electrode 902 for detection by light detector 916 while X-rays 915 are transmitted through portion 902b of electrode 902 for detection by X-ray detector 918. The light-transmissive portion 902a may include an indium tin oxide or other material coating applied to the outer surfaces of electrode 902 to enhance its electrical conductivity. Additionally, a non-reflective coating may be applied to the surfaces of electrode 902. FIG. 10 shows an embodiment in which electrodes 1002, 1004, and 1006 make up a final

| Be $\rho$ = 1.848 g/cm$^3$ | | | | | | | | | | | |
|---|---|---|---|---|---|---|---|---|---|---|---|
| X-Ray Energy | $\mu/\rho$ | $(\mu/\rho)\rho$ | $(\mu/\rho)\rho$ | Thicknesses of Beryllium (mm) | | | | | | | |
| keV | cm$^2$/g | 1/cm | 1/mm | 0.1 | 0.2 | 0.4 | 1.0 | 2.0 | 3.0 | 4.0 | 5.0 | 6.0 |
| 1.0 | 604.1 | 1116.377 | 111.6377 | 0.00% | 0.00% | 0.00% | 0.00% | 0.00% | 0.00% | 0.00% | 0.00% | 0.00% |
| 1.5 | 179.7 | 332.086 | 33.2086 | 3.61% | 0.13% | 0.00% | 0.00% | 0.00% | 0.00% | 0.00% | 0.00% | 0.00% |
| 2.0 | 74.69 | 138.027 | 13.8027 | 25.15% | 6.33% | 0.40% | 0.00% | 0.00% | 0.00% | 0.00% | 0.00% | 0.00% |
| 3.0 | 21.27 | 39.307 | 3.9307 | 67.50% | 45.56% | 20.76% | 1.96% | 0.04% | 0.00% | 0.00% | 0.00% | 0.00% |
| 4.0 | 8.685 | 16.050 | 1.6050 | 85.17% | 72.54% | 52.62% | 20.09% | 4.04% | 0.81% | 0.16% | 0.03% | 0.01% |
| 5.0 | 4.369 | 8.074 | 0.8074 | 92.24% | 85.09% | 72.40% | 44.60% | 19.89% | 8.87% | 3.96% | 1.77% | 0.79% |
| 6.0 | 2.527 | 4.670 | 0.4670 | 95.44% | 91.08% | 82.96% | 62.69% | 39.30% | 24.64% | 15.44% | 9.68% | 6.07% |
| 8.0 | 1.124 | 2.077 | 0.2077 | 97.94% | 95.93% | 92.03% | 81.24% | 66.01% | 53.63% | 43.57% | 35.40% | 28.76% |
| 10.0 | 0.6466 | 1.195 | 0.1195 | 98.81% | 97.64% | 95.33% | 88.74% | 78.74% | 69.87% | 62.00% | 55.02% | 48.82% |
| 15.0 | 0.3070 | 0.567 | 0.0567 | 99.43% | 98.87% | 97.76% | 94.48% | 89.27% | 84.35% | 79.70% | 75.30% | 71.15% |
| 20.0 | 0.2251 | 0.416 | 0.0416 | 99.58% | 99.17% | 98.35% | 95.93% | 92.02% | 88.27% | 84.67% | 81.22% | 77.91% |
| 30.0 | 0.1792 | 0.331 | 0.0331 | 99.67% | 99.34% | 98.68% | 96.74% | 93.59% | 90.54% | 87.59% | 84.74% | 81.98% |
| 40.0 | 0.1640 | 0.303 | 0.0303 | 99.70% | 99.40% | 98.80% | 97.01% | 94.12% | 91.31% | 88.58% | 85.94% | 83.37% |
| 50.0 | 0.1554 | 0.287 | 0.0287 | 99.71% | 99.43% | 98.86% | 97.17% | 94.42% | 91.75% | 89.15% | 86.62% | 84.17% |

Figure 7:
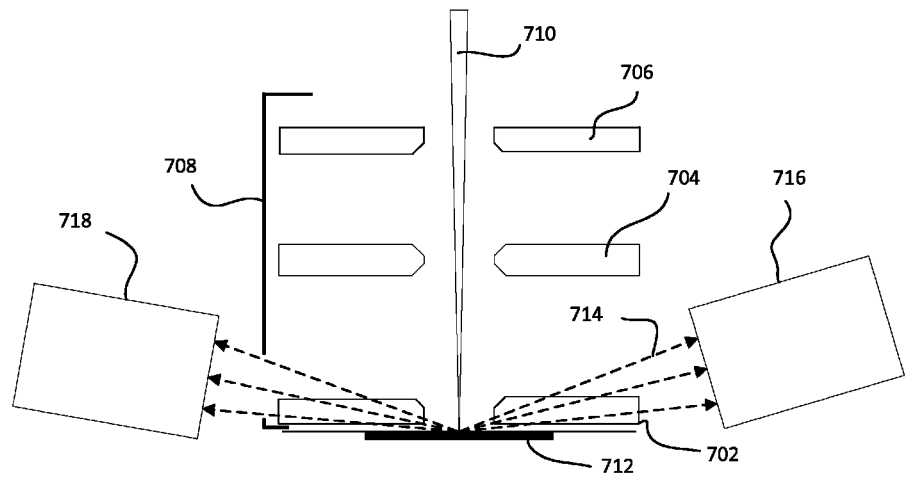
FIG. 7 is an embodiment of the invention for detecting light.
Figure 8:
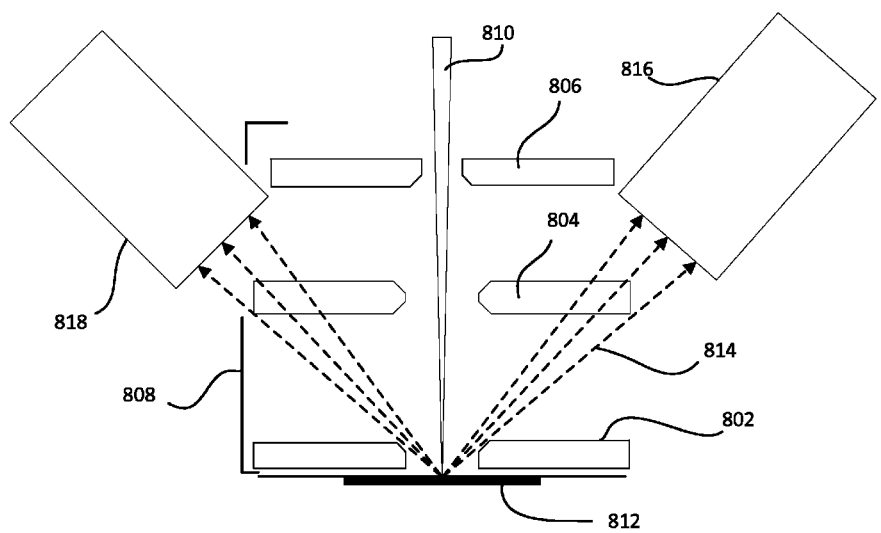
FIG. 8 is another embodiment of the invention for detecting light.

FIGS. 7 and 8 show embodiments for cathodoluminescent (CL) imaging and analysis. In the embodiment of FIG. 7, electrodes 702, 704, and 706 make up a final electrostatic lens 708 through which the beam 710 travels to impact sample 712. Light 714 is emitted from sample 712 and is transmitted through electrode 702 for detection by light detectors 716 and 718. In this embodiment, electrode 702 is formed as a solid plate constructed from a material transmissive for light. The preferable material to allow for light transmission is glass; however, other materials are contemplated by this invention. An electrically-conducting coating, such as indium tin oxide may be applied to the outer surface of electrode 702 to enhance its electrical conductivity. If desired, a non-reflective coating may be applied to the surfaces of electrode 704 to allow for the transmission of as much light through electrode 704 as possible. In FIG. 8, electrodes 802, 804, and 806 make up a final electrostatic lens 808 through which the beam 810 travels to impact sample 812. Light 814 is emitted from sample 812 at a greater angle than that shown in FIG. 7. In this embodiment, light 814 is transmitted through both electrodes 802 and 804 to be detected by light detectors 816 and 818. Both electrodes 802 and 804 are constructed as solid plates made from a light transmissive material and may include an indium tin oxide coating to enhance electrical conductivity and/or a non-reflective coating applied to the surfaces of electrodes 802 and 804 to allow for the transmission of as much light as possible.

Figure 9:
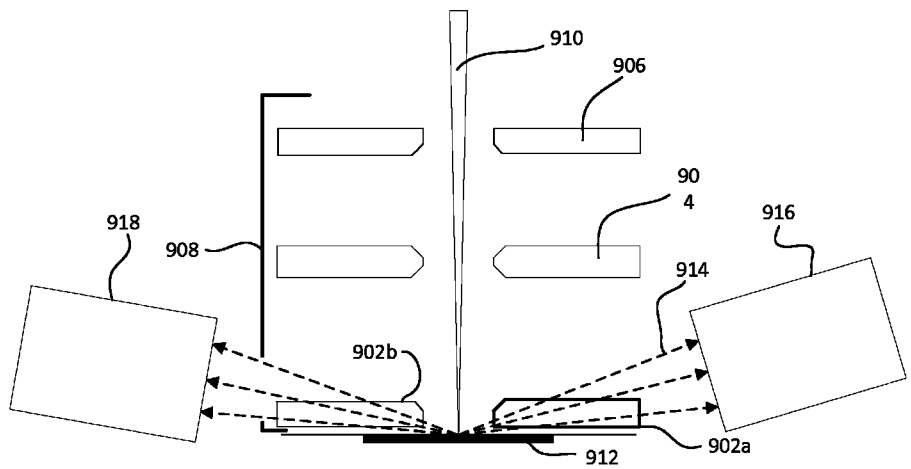
FIG. 9 is an embodiment of a transmissive lens for detecting both X-rays and light at low angles.
Figure 11:
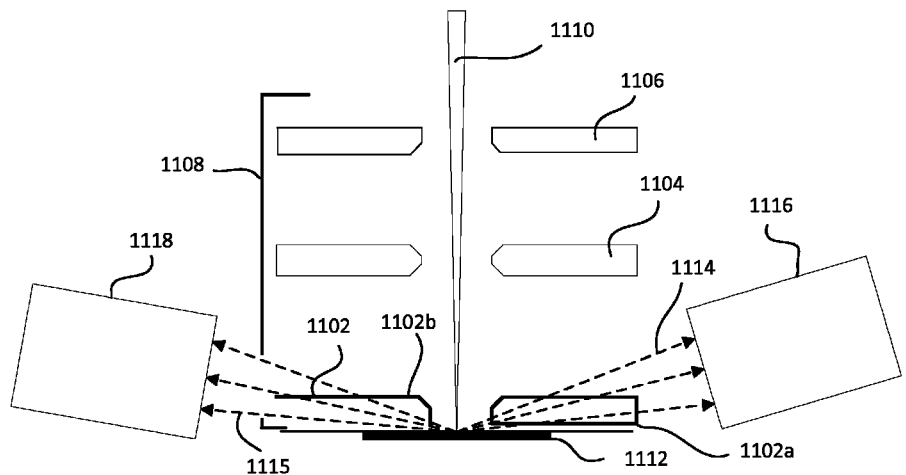
FIG. 11 is yet another embodiment for detecting low angle X-rays and light.

FIGS. 9-20 show various embodiments of the invention for combined EDS and CL imaging and analysis. FIGS. 9-11 show embodiments for detecting light and X-rays that radiate from the sample at lower angles. FIG. 9 shows an embodiment in which electrodes 902, 904, and 906 make up a final electrostatic lens 908 through which the beam 910 travels to impact sample 912. In this embodiment, electrode 902 is a composite plate made from a solid light-transmissive material in one portion 902a while the other portion 902b is composed of a solid X-ray transmissive material. Light 914 is transmit-electrostatic lens 1008 through which the beam 1010 travels to impact sample 1012 so that light 1014 is transmitted through electrode 1002 and detected by light detector 1016 while X-rays 1015 are transmitted through electrode 1002 and detected by X-ray detector 1018. In this embodiment, electrode 1002 is a composite plate made from a solid light-transmissive material in one portion 1002a formed similar to portion 902a of electrode 902 in FIG. 9. In this embodiment, portion 1002b of electrode 1002 is formed as a hollow plate with upper and lower surfaces 1002c and 1002d formed of an X-ray transmissive material. Ribs (not shown) may be added between upper and lower surfaces 1002c and 1002d for strength. FIG. 11 shows an embodiment in which electrodes 1102, 1104, and 1106 make up a final electrostatic lens 1108 through which the beam 1110 travels to impact sample 1112 so that light 1114 is transmitted through electrode 1102 and detected by light detector 1116 while X-rays 1115 are transmitted through electrode 1102 and detected by X-ray detector 1118. Electrode 1102 is similar to that shown in FIG. 10 except that portion 1102b of electrode 1102 is formed as a single thin sheet of X-ray transmissive material. If desired, ribs (not shown) may be added to the surface of portion 1102b facing sample 1112 for added strength.

Figure 12:
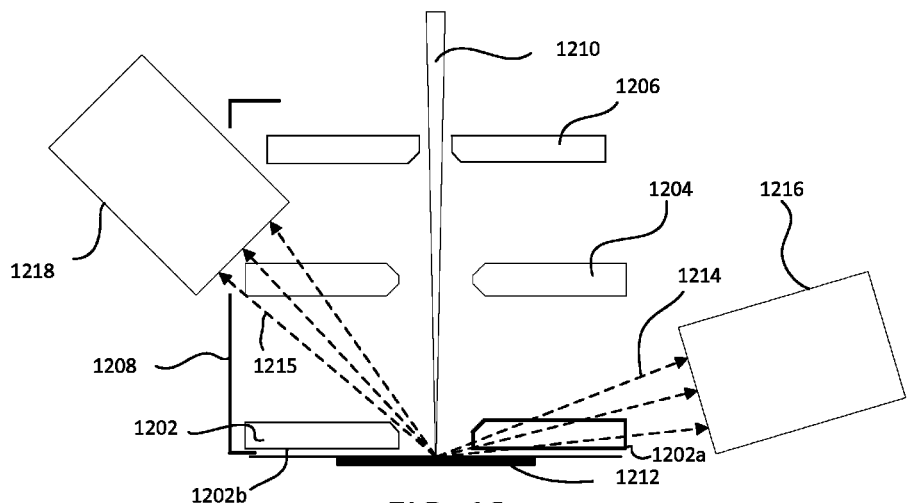
FIG. 12 is an embodiment of a transmissive lens for detecting light at low angles and X-rays at greater angles.
Figure 13:
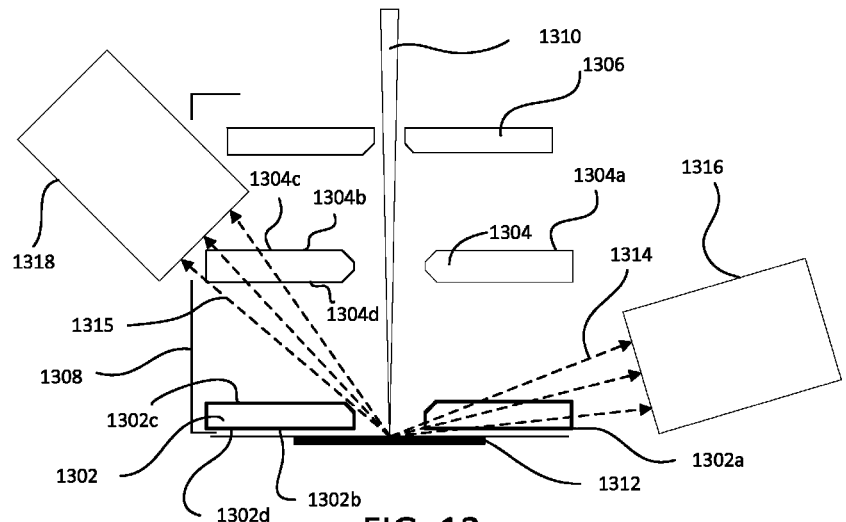
FIG. 13 is another embodiment for detecting light at low angles and X-rays at greater angles.
Figure 14:
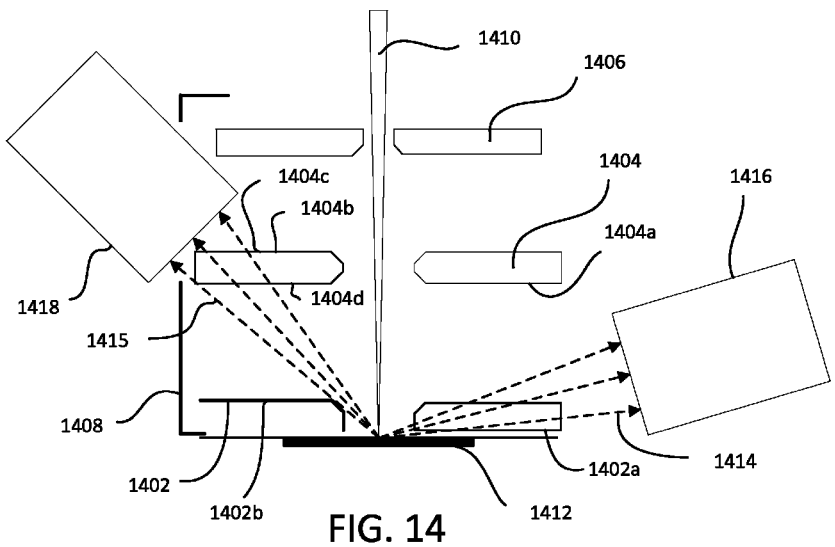
FIG. 14 is yet another embodiment for detecting light at low angles and X-rays at greater angles.

FIGS. 12-14 show embodiments for detecting light radiating at lower angles and X-rays radiating at a higher angles. FIG. 12 shows an embodiment in which electrodes 1202, 1204, and 1206 make up a final electrostatic lens 1208 through which the beam 1210 travels to impact sample 1212. In this embodiment, electrode 1202 is a composite plate made from a solid light-transmissive material in one portion 1202a while the other portion 1202b is composed of a solid X-ray transmissive material similar to electrode 902 as shown and described in FIG. 9. Electrode 1204 is formed as a solid plate composed from an X-ray transmissive material. Light 1214 is transmitted through portion 1202a of electrode 1202 to be detected by light detector 1216 while X-rays 1215 are transmitted through portion 1202b of electrode 1202 and through electrode 1204 to be detected by X-ray detector 1218. FIG. 13 shows an embodiment in which electrodes 1302, 1304, and 1306 make up a final electrostatic lens 1308 through which the beam 1310 travels to impact sample 1312. In this embodiment, electrode 1302 is a composite made from a solid-light transmissive material in one portion 1302a and the other portion 1302b is made of a hollow plate having upper and lower surfaces 1302c and 1302d made of X-ray transmissive material similar to electrode 1002 shown and described in FIG. 10. Electrode 1304 is also a composite in which one portion 1304a is made of any desired material since neither light nor X-rays are being transmitted through that portion of electrode 1304. The other portion 1304b is a hollow plate having upper and lower surfaces 1304c and 1304d made of X-ray transmissive material constructed similar to electrode 504 as shown and described in FIG. 5. Light 1314 is transmitted through electrode 1302 and detected by light detector 1316 while X-rays 1315 are transmitted through electrodes 1302 and 1304 to be detected by X-ray detector 1318. FIG. 14 shows an embodiment similar to that shown in FIG. 13 in which electrodes 1402, 1404, and 1406 make up a final electrostatic lens 1408 through which the beam 1410 travels to impact sample 1412. Electrodes 1402 and 1404 are similar to electrodes 1302 and 1304 as shown and described in FIG. 13 except that portion 1402b of electrode 1402 is formed of a single thin sheet of X-ray transmissive material similar to portion 1102b of electrode 1102 as shown and described in FIG. 11. Light 1414 is transmitted through electrode 1402 and detected by light detector 1416 while X-rays 1415 are transmitted through both electrodes 1402 and 1404 to be detected by X-ray detector 1418.

Figure 15:
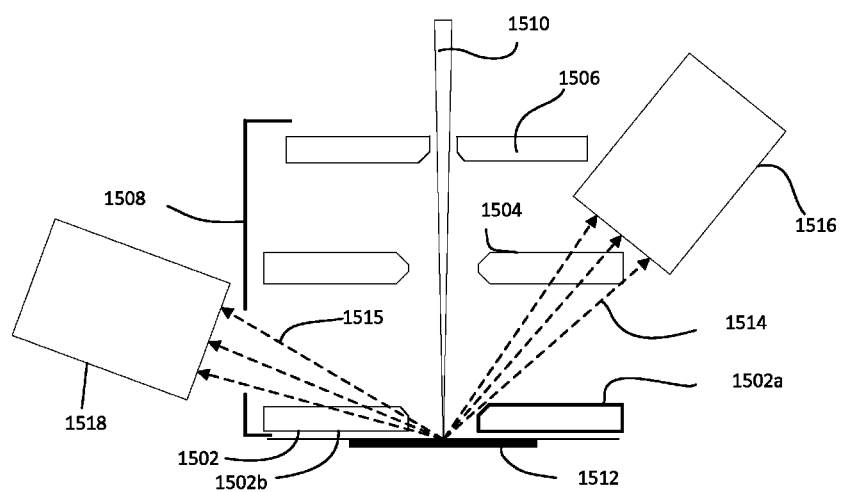
FIG. 15 is an embodiment of a transmissive lens for detecting X-rays at low angles and light at greater angles.
Figure 16:
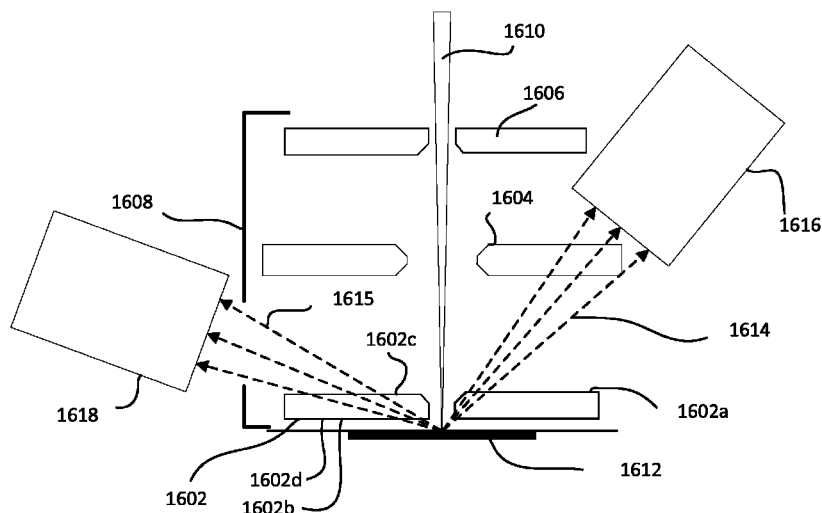
FIG. 16 is another embodiment for detecting X-rays at low angles and light at greater angles.
Figure 17:
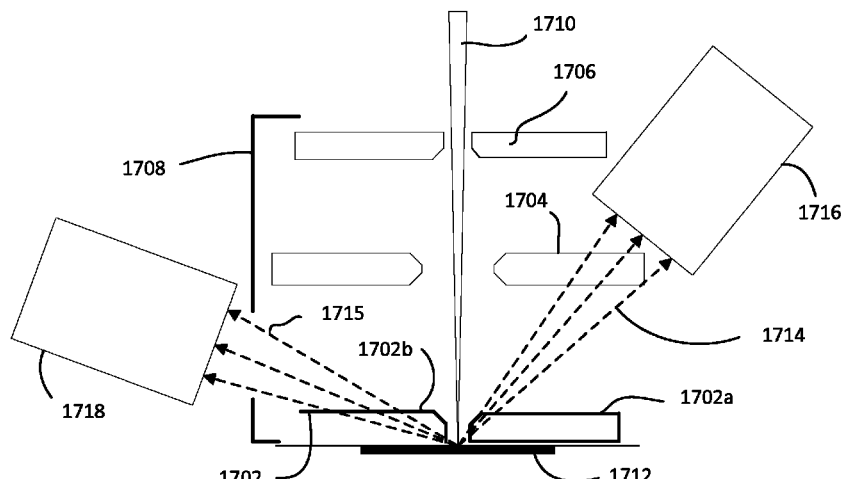
FIG. 17 is yet another embodiment for detecting X-rays at low angles and light at greater angles.

FIGS. 15-18 show embodiments for detecting light radiating at higher angles and X-rays radiating at a lower angles. FIG. 15 shows an embodiment in which electrodes 1502, 1504, and 1506 make up a final electrostatic lens 1508 through which the beam 1510 travels to impact sample 1512. In this embodiment, electrode 1502 is a composite plate made from a solid light-transmissive material in one portion 1502a while the other portion 1502b is composed of a solid X-ray transmissive material. Electrode 1504 is formed as a solid plate composed from a light transmissive material. An electrically-conducting coating, such as indium tin oxide may be applied to the outer surfaces of electrode 1504 and to portion 1502a of electrode 1502 to enhance electrical conductivity. A non-reflective coating may be applied to the surfaces of electrode 1504 and portion 1502a of electrode 1502 to allow for the transmission of as much light as possible. Light 1514 is transmitted through portion 1502a of electrode 1502 and electrode 1504 to be detected by light detector 1516 while X-rays 1515 are transmitted through portion 1502b of electrode 1502 to be detected by X-ray detector 1518. FIG. 16 shows an embodiment similar to that shown in FIG. 15, in which electrodes 1602, 1604, and 1606 make up a final electrostatic lens 1608 through which the beam 1610 travels to impact sample 1612. Electrode 1604 is formed as a solid plate composed from a light transmissive material similar to electrode 1504 shown and described above in reference to FIG. 15. Electrode 1602 is a composite made from a solid-light transmissive material in one portion 1602a and the other portion 1602b is made of a hollow plate having upper and lower surfaces 1602c and 1602d made of X-ray transmissive material similar to electrode 1302 shown and described in reference to FIG. 13. Light 1614 is transmitted through portion 1602a of electrode 1602 and electrode 1604 to be detected by light detector 1616 while X-rays 1615 are transmitted through portion 1602b of electrode 1602 to be detected by X-ray detector 1618. FIG. 17 shows an embodiment similar to that shown in FIG. 15, in which electrodes 1702, 1704, and 1706 make up a final electrostatic lens 1708 through which the beam 1710 travels to impact sample 1712. Electrode 1704 is formed as a solid plate composed from a light transmissive material similar to electrode 1504 shown and described above in reference to FIG. 15. Electrode 1702 is a composite made from a solid-light transmissive material in one portion 1702a and the other portion 1702b is formed as a single thin sheet of X-ray transmissive material similar to electrode 1402 as shown and described with reference to FIG. 14. Light 1714 is transmitted through portion 1702a of electrode 1702 and electrode 1704 to be detected by light detector 1716 while X-rays 1715 are transmitted through portion 1702b of electrode 1702 to be detected by X-ray detector 1718.

Figure 18:
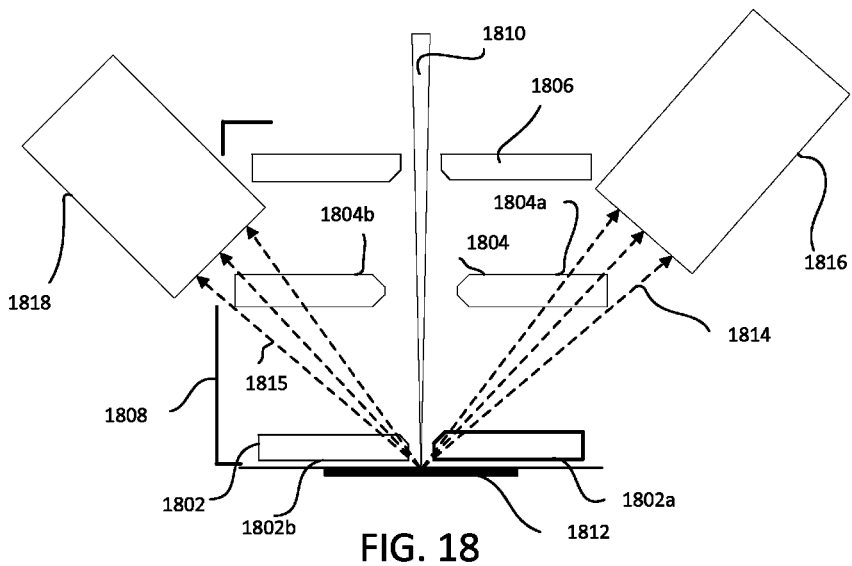
FIG. 18 is an embodiment of a transmissive lens for detecting both X-rays and light at greater angles.
Figure 19:
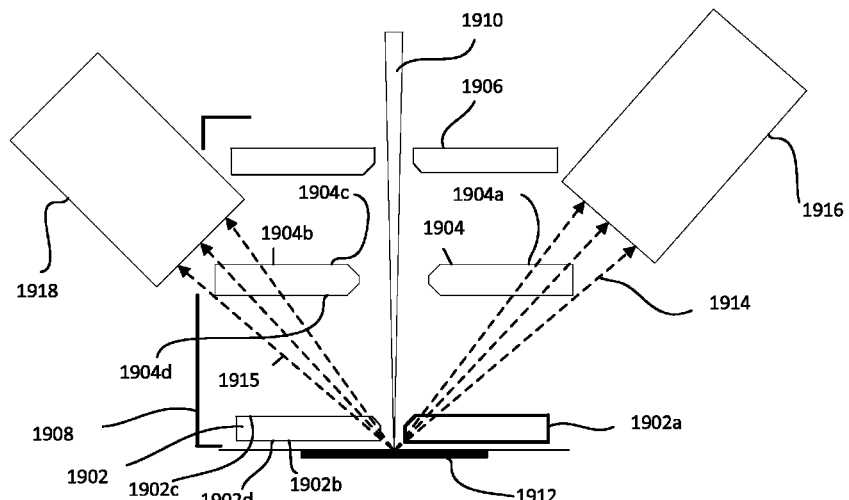
FIG. 19 is another embodiment for detecting both X-rays and light at greater angles.
Figure 20:
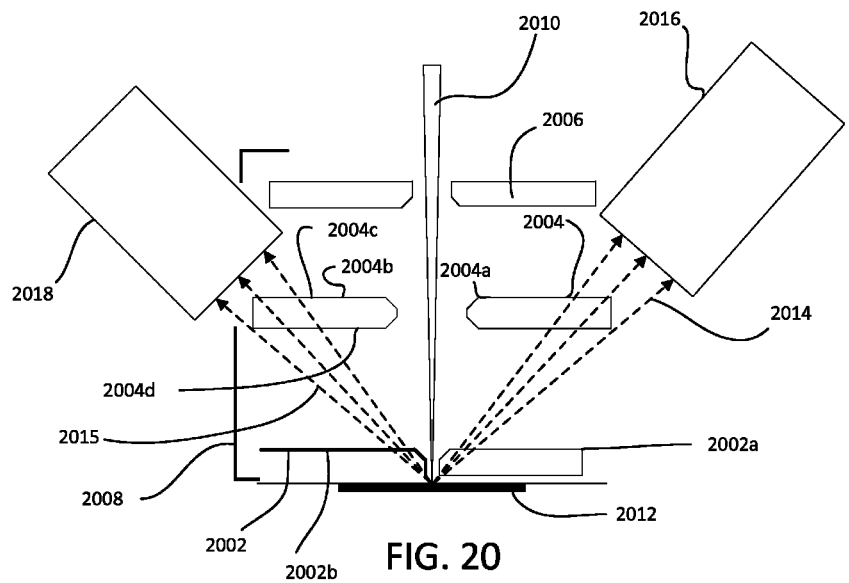
FIG. 20 is yet another embodiment for detecting both X-rays and light at greater angles.

FIGS. 18-20 show embodiments for detecting both light and X-rays radiating at greater angles from a sample. FIG. 18 shows an embodiment in which electrodes 1802, 1804, and 1806 make up a final electrostatic lens 1808 through which the beam 1810 travels to impact sample 1812. In this embodiment, both electrodes 1802 and 1804 are formed as composite plates made from a solid light-transmissive material in portions 1802a and 1804a, respectively, while portions 1802b and 1804b are made of a solid X-ray transmissive material. The light transmissive and X-ray transmissive materials are similar to those discussed in the embodiments described above. Light 1814 is transmitted through portion 1802a of electrode 1802 and portion 1804a of electrode 1804 to be detected by light detector 1816 while X-rays 1815 are transmitted through portion 1802b of electrode 1802 and portion 1804b of electrode 1804 to be detected by X-ray detector 1818. FIG. 19 shows an embodiment in which electrodes 1902, 1904, and 1906 make up a final electrostatic lens 1908 through which the beam 1910 travels to impact sample 1912. Electrodes 1902 and 1904 are composites made from a solid-light transmissive material in portions 1902a and 1902b, respectively, similar to electrodes 1802 and 1804 described above in FIG. 18. However, portions 1902b of electrode 1902 and 1904b of electrode 1904 are made of a hollow plate with upper and lower surfaces 1902c, 1902d and 1904c, 1904d, respectively, made from thin sheets of an X-ray transmissive material. Both portions 1902b and 1904b are constructed in a manner similar to portion 1302b of electrode 1302 shown and described with reference to FIG. 13. Light 1914 is transmitted through portion 1902a of electrode 1902 and portion 1904a of electrode 1904 to be detected by light detector 1916. X-rays 1915 are transmitted through portion 1902b of electrode 1902 and portion 1904b of electrode 1904 to be detected by X-ray detector 1918. FIG. 20 shows an embodiment in which electrodes 2002, 2004, and 2006 make up a final electrostatic lens 2008 through which the beam 2010 travels to impact sample 2012. Electrodes 2002 and 2004 are composites with light-transmissive portions 2002a and 2004a and X-ray transmissive portions 2002b and 2004b similar electrodes 1902 and 1904 as shown and described with reference to FIG. 19. In this embodiment, portion 2002b of electrode 2002 is formed as a single thin sheet of X-ray transmissive material in a manner similar to portion 1702b of electrode 1702 in FIG. 17.

While the embodiments described above use the transmissive lens electrode to transmit emanations from the sample, the transmissive lens element can also be used to transmit radiation to the sample. For example, light from a laser or other source can be directed to the sample through a transmissive lens electrode to induce emissions from the sample. In some embodiments, radiation of a first type is transmitted through the transmissive electrode while emissions of a second type, such as light or charged particles, are collected. The emissions of the second type can be collected through the transmissive electrode, through the aperture in the electrode, or by a detector that detects the emissions travelling between the electrode and the sample.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An electrostatic lens for use within a charged particle beam system, comprising;
   multiple focusing elements being spaced from each other to define an optical axis along which a charged particle beam travels through the lens and onto a sample positioned closely adjacent the lens causing emanations from the sample to be radiated back through the lens, wherein at least one of the elements is transmissive for the emanations, and
   at least one detector for detecting the emanations.

2. The lens of claim 1, wherein the at least one focusing element is made from a material that is transmissive for X-rays.

3. The lens of claim 2, wherein the at least one focusing element is made from a material having a low atomic number.

4. The lens of claim 3, wherein the low atomic number material is beryllium.

5. The lens of claim 2, wherein the at least one focusing element is made as a solid plate.

6. The lens of claim 2, wherein the at least one focusing element is formed as a hollow plate having opposed surfaces.

7. The lens of claim 2, wherein the at least one focusing element is formed as a thin sheet.

8. The lens of claim 1, wherein the at least one focusing element is formed from a material that is transmissive for light.

9. The lens of claim 8, wherein the at least one focusing element is formed as a solid plate.

10. The lens of claim 1, wherein the at least one focusing element is formed as a composite element with a first portion that is transmissive for X-rays and a second portion that is transmissive for light.

11. The lens of claim 10, wherein the first portion is formed of a material having a low atomic number and the second portion is formed of glass.

12. The lens of claim 11, wherein both the first and second portions are constructed as a solid plate.

13. The lens of claim 11, wherein the second portion is constructed as a solid plate and the first portion is constructed as a hollow plate having opposed surfaces.

14. The lens of claim 11, wherein the second portion is constructed as a solid plate and the first portion is constructed as a thin sheet.

15. A method of detecting emanations that radiate from a sample caused by impact from a charged particle beam, the method comprising,
    providing an electrostatic lens for placement closely adjacent a sample through which a charged particle beam travels to impact the sample causing emanations to be radiated from the sample back through the lens,
    providing at least one focusing element located within the lens for focusing the beam onto the sample, wherein at least one of the focusing elements is transmissive for the emanations, and
    providing at least one detector for detecting the emanations.

16. The method of claim 15, wherein the at least one focusing element is made from a material that is transmissive for X-rays.

17. The method of claim 16, wherein the at least one focusing element is made from a material having a low atomic number.

18. The method of claim 17, wherein the material is beryllium.

19. The method of claim 15, wherein the at least one focusing element is made from a light-transmissive material.

20. The method of claim 19, wherein the light-transmissive material is glass.

21. The method of claim 15, wherein the at least one focusing element is formed as a composite element with a first portion that is transmissive for X-rays and a second portion that is transmissive for light.

22. The method of claim 21, wherein the first portion is made of a material having a low atomic number and the second portion is made of glass.

23. The method of claim 22, wherein the material having a low atomic number is beryllium.

* * * * *